United States Patent

[11] 3,615,955

[72] Inventors Joseph Regh
Wappingers Falls, N.Y.;
Gene A. Silvey, deceased, late of
Poughkeepsie, N.Y. by Harriett E. Silvey,
executrix
[21] Appl. No. 804,739
[22] Filed Feb. 28, 1969
[45] Patented Oct. 26, 1971
[73] Assignee International Business Machines
Corporation
Armonk, N.Y.

[54] METHOD FOR POLISHING A SILICON SURFACE
10 Claims, 6 Drawing Figs.

[52] U.S. Cl. .......... 156/17,
156/345, 252/79.3
[51] Int. Cl. .......... H01l 7/50
[50] Field of Search .......... 156/17, 20;
117/227; 252/79.3

[56] References Cited
UNITED STATES PATENTS
3,436,259 4/1969 Regh et al. .......... 117/227

*Primary Examiner*—Jacob H. Steinberg
*Attorneys*—Hanifin & Jancin and George O. Saile ABSTRACT: A silicon surface is polished by a simultaneous application of mechanical and chemical polishing procedures. The silicon surface to be polished is maintained continuously wetted with an excess quantity of a displacement plating solution containing a mercury cation and a fluoride anion. Mercury is deposited on the surface by the displacement of silicon and a simultaneous and continuous wiping of the surface removes the mercury from the high areas on the silicon surface.

PATENTED OCT 26 1971 3,615,955

INVENTORS
JOSEPH REGH
GENE A. SILVEY

BY George O. Saile
ATTORNEY

METHOD FOR POLISHING A SILICON SURFACE

CROSS REFERENCES TO RELATED APPLICATIONS

The patent application of Joseph Regh, Gene A. Silvey and James R. Gardiner, Ser. No. 549,586, filed May 12, 1966, and entitled "Method for Plating and Polishing A Silicon Planar Surface" is directed to a related invention.

BACKGROUND OF THE INVENTION

1. Field of the Invention

Semiconductor devices, such as integrated monolithic circuits, transistors, diodes, passive devices and so forth, are formed by various additive techniques, such as diffusion and epitaxial growth, in planar silicon surfaces. The perfection of this silicon planar surface in regard to surface fine-structure down to an order of Angstrom units, surface planarity, uniformity and freedom from mechanical damage is a fundamental requirement for the manufacture of semiconductor devices. This can be more greatly appreciated by the fact that today more than 20,000 active and passive devices can be formed in an inch and a quarter diameter silicon wafer. The surface planarity of the wafer becomes highly critical in photolithographic masking techniques because of the constant effort to decrease the physical device dimensions, Increase in distance between the mask and wafer surface caused by significant deviations from the ideally planar wafer unfavorably affects the image resolution of fine device structure on the surface of the wafer. This nonplanarity effect becomes more pronounced as you proceed toward the edge of the wafer. Poor device yields are the result at the periphery of the wafer. The extent of the poor device area is dependent upon the degree of nonplanarity of the wafer. The surface fine-structure characteristic over the entire wafer is also an extremely important characteristic as it can produce poor devices throughout the wafer. Mechanical or physical defects and irregularities in the planar silicon surface also produce marginal or useless devices throughout the entire surface which also can result in the waste of manufacturing time and expense.

2. Description of the Prior Art

The prior art has used a wide variety of processes in an attempt to overcome these critical problems. Some of these processes include vapor polishing, chemical etching, electropolishing, mechanical lapping and polishing, and combinations of these polishing steps. The usual initial procedure for polishing planar silicon wafers involves a series of abrading and polishing steps using polishing ingredients of graduated fineness. These mechanical polishing techniques are able to remove most surface scratches and pits. However, they themselves produce damage to the crystal surface depending upon particle size of the polishing compounds and the environmental conditions such as pressure and temperature. Because of this, the final step in the polishing procedure is normally a chemical etch to remove these defects in the silicon material. While these procedures have greatly improved the surface characteristics of silicon surfaces for manufacture of semiconductor devices, the procedures are time consuming and still do not produce the crystallographically perfect silicon planar surface. Further, the achievement of planarity and minimizing of surface fine-structure of the polished wafer are still not completely solved problems.

The before mentioned patent application, Ser. No. 549,586, filed May 12, 1966, is directed to a copper or silver displacement plating and polishing process that provided polished and planar silicon surfaces substantially improved over the prior art. This process provides excellent polishing of silicon where the silicon contains impurities in normal quantities. However, where the silicon is heavily doped with impurities, that is where the silicon is $N^+$ or $P^+$ and there are nonsilicon impurity precipitates found within the body of silicon to be polished, the process of the before mentioned patent application does not polish the silicon surface to the desired perfection.

SUMMARY OF THE INVENTION

It is, therefore, an object of this invention to provide a process for polishing silicon semiconductor surfaces to a high-degree of surface perfection regardless of the impurity concentration in the silicon material to be polished.

It is a further object of this invention to provide a chemical-mechanical method of polishing silicon wafers which produce an excellent planar surface with little fine structure on $N^+$ or $P^+$ silicon surfaces.

These and other objects are accomplished in accordance with the broad aspects of the present invention by providing a process involving a simultaneous application of mechanical and chemical polishing procedures. The silicon planar surface to be polished is maintained continuously wetted with an excess quantity of a displacement plating solution, while it is continuously wiped, using pressure, with a firm surface. The displacement plating solution contains a mercury cation and a fluoride anion and is maintained at a pH of less than about 7. The result of this wetting of the silicon surface with the solution is the displacement plating of mercury in some form for the silicon on the silicon surface. The simultaneous and continuous wiping of the silicon surface removes the mercury from the high-areas on the silicon surface. The mercury is a soft or pastelike material and does not have a high-surface adhesion to the silicon or to impurity particles therein. There is, therefore, no build up of mercury around the impurity precipitates or on the silicon surface and the resulting polished surface is of a superior quality regardless of the doping concentration within the silicon. In this manner, the silicon surface is brought to a state of substantial perfection, excellent surface of low fine-structure and freedom from damage.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

The silicon planar surface which is generally used as the starting surface for the additive processes to produce semiconductor devices is in the form of a thin monocrystalline silicon wafer. These silicon wafers are sawed from cylinders of monocrystalline silicon, and lapped on a lapping machine using a fine abrasive. The silicon wafer surface has a fairly uniform roughness, but is mechanically damaged. At this point, the polishing procedure of the present invention is initiated.

Figure 1:
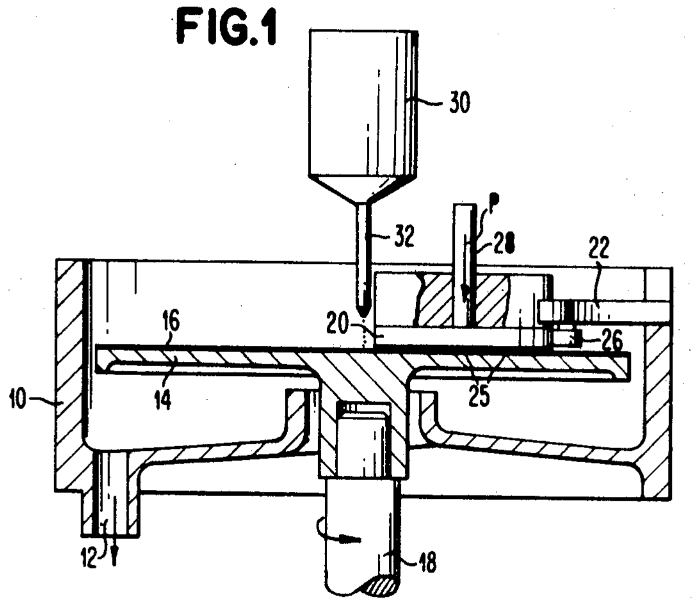
FIG. 1 shows a side view of an apparatus, partially in section which is useful in practicing the polishing process of the invention.
Figure 2:
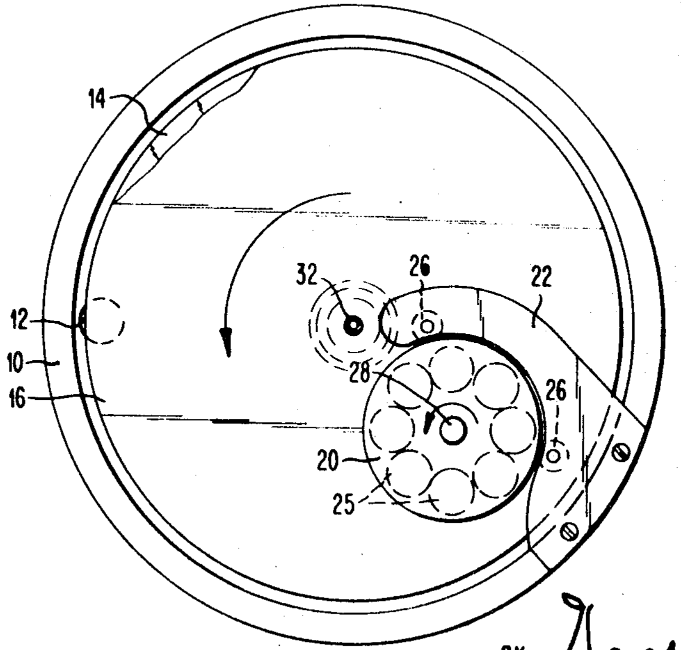
FIG. 2 is a plain view of the FIG. 1 apparatus.

Referring now to FIGS. 1 and 2, the simultaneous chemical-mechanical process of the present invention can be accomplished using the apparatus shown. The polishing machine includes a bowl 10 having a fluid outlet 12 and a driven plate 14. Mounted on the plate 14 by any suitable means (not shown) is a soft, firm surface 16 composed of a thick, porous paper, such as Pellon paper, or a napped cloth, such as Microcloth. The plate 14 is rotated by means of suitable driving means (not shown) coupled through shaft 18. The silicon wafers 25 to be polished are secured to the smaller plate 20 by means of suitable adhesive or other suitable method. This plate 20 with its wafer mounted thereon is maintained against the surface 16 by arm 22 having bearing surfaces 26 and a substantial pressure P applied through shaft 28 to urge wafers strongly against the surface 16. The arm 22 is suspended from the polishing bowl edge and positioned on the side of the plate 20 in the path of its normal rotation which is caused by the rotation of plate 14. The rotation of plate 14 produces a rotation of the plate 20. The surface of the silicon wafers is continuously wetted with excess quantity of a displacement plating solution by flowing the solution from container 30 through its restricted opening 32 onto the surface 16 of rotating plate 14. Excess fluid is splashed from the end of the rotating plate 14 and flows out of the excess fluid opening 12.

Figure 3A:
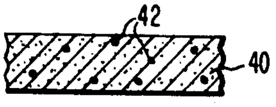
FIG. 3A, FIG. 3B, FIG. 3C and FIG. 3D illustrate the problem of the prior art wherein large nonsilicon impurity precipitates are encountered during displacement polishing.
Figure 3C:
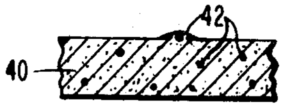
Figure 3B:
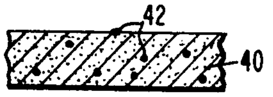
Figure 3D:
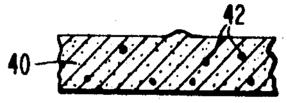

Referring now to FIGS. 3A, 3B, 3C and 3D there is shown schematically and greatly enlarged the polishing process of the above referred to patent application wherein a very highly doped silicon wafer 40, that is $N^+$ or $P^+$, is being polished and a nonsilicon precipitate 42 is homogeneously distributed throughout the wafer. The wafer 40 having the nonsilicon particles 42 distributed throughout its body is gradually polished and its upper surface worn away until as shown in FIG. 3B one of the particles 42 appears at its top surface being polished. The silicon surface will continue to be worn away by the simultaneous displacement plating and wiping process. The exposed particle 42 and the immediate silicon surface surrounding it will be plated with copper. The wiping action continues to polish the remaining wafer surface but is not effective in the region of the particle 42 which is not displacement plated and therefore is not polished away as shown in FIG. 3C. As the particle 42 is elevated above the surface additional surrounding silicon surface will not be wiped free of plated metal and thereby stopping polishing over this additional area. A "-hill" of silicon will thereby be formed surrounding the particle until the particle is sheared off by the force of the wiping action. The resulting structure is shown in FIG. 3D. Continuation of the polishing process at this point will, of course, act to remove the "hill," but should the process be completed the wafer's surface would not be perfect.

It is thusly seen that the effect of a large nonsilicon particle which by itself cannot even be seen with an optical microscope (x-ray transmission photographs will show them as black spots), is to make an enlarged "hill" at the site of the particle. The "hill" can be seen with the unaided eye. Smaller particles would cause little problems since they would be sheared off and the small "hill" polished away by the displacement plating and wiping action.

The use of mercury as the displacement plating metal has been found to overcome the before mentioned problems. The form of the mercury plating on the silicon is a white colored, soft and pastelike, rather than a firm metal film. The mercury is readily wiped off with the polishing paper or cloth because of its low-adhesion to the silicon surface and therefore does not present the problem described in the preceeding paragraph.

The class of silicon monocrystalline materials wherein the mercury polish is particularly advantageous is the $N^+$ and $P^+$ doped materials. It is in these impurity concentrations where nonsilicon precipitates are found in the silicon. They form due to close proximity to the impurity's maximum solubility in silicon or due to the processing involved in growing or formation of the silicon monocrystal. The precipitate problem varies depending upon the particular impurity present, but presents itself with all P and N impurities. The problem is present with, for example, arsenic and antimony N-type impurity concentrations of $1\times10^{18}$ atoms/cc.

There must be a relative motion between the wafer surface being polished and the polishing surface. The pressure applied is critical and must be greater than about 1 pound per square inch with a 12 inch diameter polishing plate and 80 to 250 r.p.m. rotation speed to obtain the desired polishing results. This pressure can be lowered if higher speeds of the wafers moving across the polishing plate are used. These higher speeds can, alternately, be caused by increasing the polishing plate rotation speed, increasing the diameter of the polishing plate, increasing the diameter of the wafer mounting plate or any combinations thereof. It is also preferred that the rotation plate 20 also be rotated with respect to plate 14. The rotation can be induced by plate 14 or by an external driving means. The induced rotation can be effected by the rotation of plate 14 with proper application of weight or pressure P applied to plate 20.

A final step in the process is preferred to free the polishing plate of residual polishing solution and to remove the maximum amount of mercury from the polished silicon surface. This step is simply to replace the flow of plating solution with a flow of nonplating medium such as water and to allow the soft, firm surface 16 to stop the silicon removal action and to thereafter remove the mercury for a short period of time.

The nitrate mercury salt is preferred to put the mercury ion into the deplating solution because it brings into the solution no unwanted impurities. The sulfate also works nearly as well as the nitrate. The halides, such as the chloride, are less desirable because their complexing tendencies with the mercury and the ammonium ions tend to reduce the silicon removal rate.

The following example is included merely to aid in the understanding of the invention, and variations may be made by one skilled in the art without departing from the spirit and scope of this invention.

EXAMPLE

A cylinder of monocrystalline <111> P type (Boron doped $1.7\times10^{15}$, 8 ohm-cm.)silicon of 1 ¼inch diameter was sliced into a large number of wafers, approximately 12 mils. in thickness. The surfaces of the wafers were lapped, using a 12 micron lapping compound. The wafers were then ultrasonically cleaned with soap and water. A group of 9 wafers were mounted on plates 20 using glycol phthalate resin as the adhesive. The wafers were lapped coplanar on a lapping machine using 5 micron alumina abrasive. The FIG. 1 and FIG. 2 polishing machine was used and a constant pressure of about 1 pound per square inch was applied. The diameter of plate 14 was 15 inches and plate 20 was 5½ inches. Microcloth was used as the surface layer 16. The revolutions per minute for the plate 14 were 72 r.p.m. The polishing time was 120 minutes. The concentration of the ammonium fluoride and mercury nitrate in the plating solution was 6 N and 0.3 N, respectively. The pH was 6.5. After 119 minutes of polishing, the polishing solution was replaced with water. Water was flowed onto the plate through orifice 32 for 1 minute. The machine was then stopped, and the wafers were cleaned with water and then removed from plate 20. The wafers were then cleaned by submersing them in acetone to remove glycol phthalate mounting resin. Residual mercury was then removed with hot concentrated nitric acid.

While this invention has been particularly described with reference to preferred embodiments thereof, it will be understood by those skilled in the art that the foregoing and other changes in form and details may be made therein without departing from the spirit and scope of the invention.

What is claimed is:

1. A method for polishing a silicon surface to a high-degree of surface perfection wherein the silicon surface can have an impurity concentration higher than $1\times10^{18}$ atoms/cc. comprising:

maintaining the said silicon surface continuously wetted with an excess quantity of a displacement plating solution having a pH less than 7 containing a mercury cation and fluoride anion to cause a displacement plating of mercury onto the said silicon surface;

the said fluoride anion is maintained in excess quantities to said mercury cation which is present in quantity sufficient for the desired polishing rate; and continuously wiping the said silicon surface with a firm surface using a substantial pressure while maintaining a relative movement between the said silicon surface and said firm surface to remove the said mercury from the high-points of said silicon surface.

2. The method of claim 1 wherein the said solution is aqueous; the mercury cation is brought into the said solution by use of mercury nitrate; and the fluoride anion is brought into said solution by use of ammonium fluoride.

3. The method of claim 1 wherein the said silicon impurity is arsenic or antimony and the solution is maintained at a pH between about 5 to 7.

4. The method of claim 1 wherein the said pressure applied is above 1 pound per square inch.

5. The method of claim 1 wherein the said silicon surface is planar and is one face of a silicon wafer and said firm surface is a supported paper layer.

6. The method of claim 1 wherein the said silicon surface is planar and is one face of a silicon wafer and said firm surface is a supported napped cloth layer.

7. A method for polishing a monocrystalline silicon planar surface to a high-degree of surface perfection suitable for epitaxial deposition wherein the silicon planar surface can have an impurity concentration higher than $1\times10^{18}$ atoms/cc. comprising:

maintaining the said silicon surface continuously wetted with an excess quantity of an aqueous displacement plating solution having a PH less than 7 containing a mercury cation and a fluoride anion to cause a displacement plating of mercury onto the said silicon surface;

the said fluoride anion is maintained in excess quantities to said mercury cation which is present in quantity sufficient for the desired polishing rate;

continuously wiping the said silicon surface with a soft, firm surface using a pressure greater than about 1 pound per square inch while maintaining a relative rotating movement between the said silicon surface and the said soft surface to remove the said mercury from the high-points of said silicon surface; and after the said silicon surface has been adequately polished, replacing said plating solution with a nonplating medium wetting the said silicon surface to prevent further polishing and allow said firm surface to remove the maximum amount of said mercury possible from said polished silicon surface.

8. The method of claim 7 wherein the said solution is aqueous; the mercury cation is brought into the said solution by use of mercury nitrate; the fluoride anion is brought into said solution by use of ammonium fluoride; and the said solution pH is maintained between about 5 and 7.

9. The method of claim 7 wherein the said planar silicon surface is one face of a silicon wafer and said firm surface is a supported paper layer.

10. The method of claim 7 wherein the said planar silicon surface is one face of a silicon wafer and said firm surface is a supported napped cloth layer.

* * *

PO-1050
(5/69)

UNITED STATES PATENT OFFICE
CERTIFICATE OF CORRECTION

Patent No. 3,615,955 Dated October 26, 1971

Inventor(s) Joseph Regh and Gene A. Silvey

It is certified that error appears in the above-identified patent and that said Letters Patent are hereby corrected as shown below:

| | |
|---|---|
| Column 4, Line 25 (In the Specification Page 8, Line 3) | change "12 1/4 to--1 1/4-- |
| Column 5, Claim 3, Line 3 (In the Claims, Claim 3, Line 2) | change "to" to--and-- |
| Column 5, Claim 4, Line 5 (In the Claims, Claim 4, Line 2) | after "above" insert--about-- |

Signed and sealed this 13th day of June 1972.

(SEAL)
Attest:

EDWARD M.FLETCHER,JR.
Attesting Officer

ROBERT GOTTSCHALK
Commissioner of Patents